United States Patent [19]

Gaalema

[11] 4,262,258

[45] Apr. 14, 1981

[54] CCD CORRELATED QUADRUPLE SAMPLING PROCESSOR

[76] Inventor: Robert A. Frosch, Administrator of the National Aeronautics and Space Administration, with respect to an invention of Steve D. Gaalema, Los Angeles, Calif.

[21] Appl. No.: 9,889

[22] Filed: Feb. 6, 1979

[51] Int. Cl.³ .................. H03K 5/00; H03K 5/159
[52] U.S. Cl. ........................... 328/151; 307/352; 307/353
[58] Field of Search ............... 307/353, 352; 328/151

[56] References Cited

U.S. PATENT DOCUMENTS

| | | | |
|---|---|---|---|
| 3,819,953 | 6/1974 | Puckette et al. | 307/353 |
| 3,851,260 | 11/1974 | Colin | 307/353 |
| 3,991,322 | 11/1976 | Bush et al. | 307/252 |

Primary Examiner—Harold A. Dixon

Attorney, Agent, or Firm—Monte F. Mott; John R. Manning; Paul F. McCaul

[57] ABSTRACT

A correlated quadruple sampling processor for improved signal-to-noise ratio in the output of a charge-coupled device (CCD) is comprised of: switching means for momentarily clamping a CCD signal line at a first reference level A before a CCD data pulse and then obtaining a first data sample B with respect to the reference A during a CCD data pulse, and storing the positive sample B-A; switching means for momentarily clamping the CCD signal line a second time at the level C during the presence of the CCD data pulse and then obtaining a second data sample D with respect to the reference level C after the CCD data pulse, and storing the negative sample D-C; and means for obtaining the difference between the stored samples +(B-A) and −(D-C), thus increasing the net signal amplitude by a factor of about 2 while the noise would be increased by only a factor of $\sqrt{2}$ since there will be no correlation in the noise between the double samples +(B-A) and −(D-C) effectively added.

9 Claims, 7 Drawing Figures

CCD CORRELATED QUADRUPLE SAMPLING PROCESSOR

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

This invention relates to a method and apparatus for sampling data pulses, such as at the output of a charge-coupled device (CCD), and more particularly to improving the signal-to noise ratio in the sampled data.

The development in recent years of charge-coupled semiconductor devices as a result of the MOS-FET technology has led to making analog data registers practical. An article by Gilbert F. Amilio entitled "Charge-Coupled Devices," pages 23-31 in *Scientific American*, Volume 230, No. 2, February 1974 explains the structure and analyzes operation of such a charge-coupled device (CCD). Another teaching of such devices can be found in U.S. Pat. No. 3,814,955 issued to Yokichi Itoh et al in 1974. Briefly, a CCD consists of a silicon dioxide layer deposited on a silicon substrate material. A plurality of metal transfer electrodes are deposited on the silicon dioxide layer. In N-channel devices, an N-material input diode is formed in the P-type silicon substrate to provide a diode charge-coupling into the device, and an N-material output diode is formed in the P-type silicon substrate to provide a diode charge-coupling out of the device, or a floating gate can be used to sense the charge. By pulsing the transfer electrodes in sequence, it is possible to move potential charges of minority carriers along the surface, or in a buried channel of the silicon substrate. Packets of electrons may be transferred into and out of potential wells of these charge-coupled devices virtually intact, and from potential well to potential well and out through the output diode.

Charge-coupled devices have been used not only in implementing radar data processing components, but also more recently in image sensing elements in a matrix for a full frame of image picture elements (pixels). A major advantage of charge-coupled devices is that once a frame has been stored as charge packets proportional to light intensity of the pixels, they may be read out serially from one CCD by shifting the last row out serially, and shifting the rows down in parallel, or simply queuing all of the rows for full serial-shift readout. In either case, a CCD is read out in response to a clock pulse from a stable source used for synchronization in a CCD data processing system. The problem has been achieving a sufficiently high signal-to-noise ratio to make CCD imaging effective for very faint image sources, such as in sensing stellar visual images. The output of CCD systems is conventionally obtained by a sampling technique using a double sampling technique.

OBJECTS AND SUMMARY OF THE INVENTION

An object of this invention is to achieve a better signal-to-noise ratio in sampled data pulses by a novel correlated quadruple sampling technique. Another is to improve the sampling of CCD data pulses.

In accordance with the present invention, switching means are provided to clamp the reference level of an input signal line at a time A before a data pulse and to obtain a sample with respect to that reference at time B during a data pulse, to clamp the signal line again at a time C during the presence of the data pulse for a reference level and to obtain another sample with respect to the latter reference level at a time D after the data pulse. The two samples (B-A) and (D-C) are stored in separate capacitors, and their difference is used to produce a net signal gain of 2. A single switch may be employed to clamp the signal line to the reference levels A and C, while separate switches are employed to obtain the samples (B-A) and (D-C), but separate switches are preferably used to clamp separate signal lines to the reference levels A and C. In either case the signal line being clamped is isolated from a signal input line by a blocking capacitor.

The novel features of the invention are set forth with particularity in the appended claims. The invention will best be understood from the following description when read in conjunction with the accompanying drawings.

DESCRIPTION OF PREFERRED EMBODIMENTS

Figure 1:
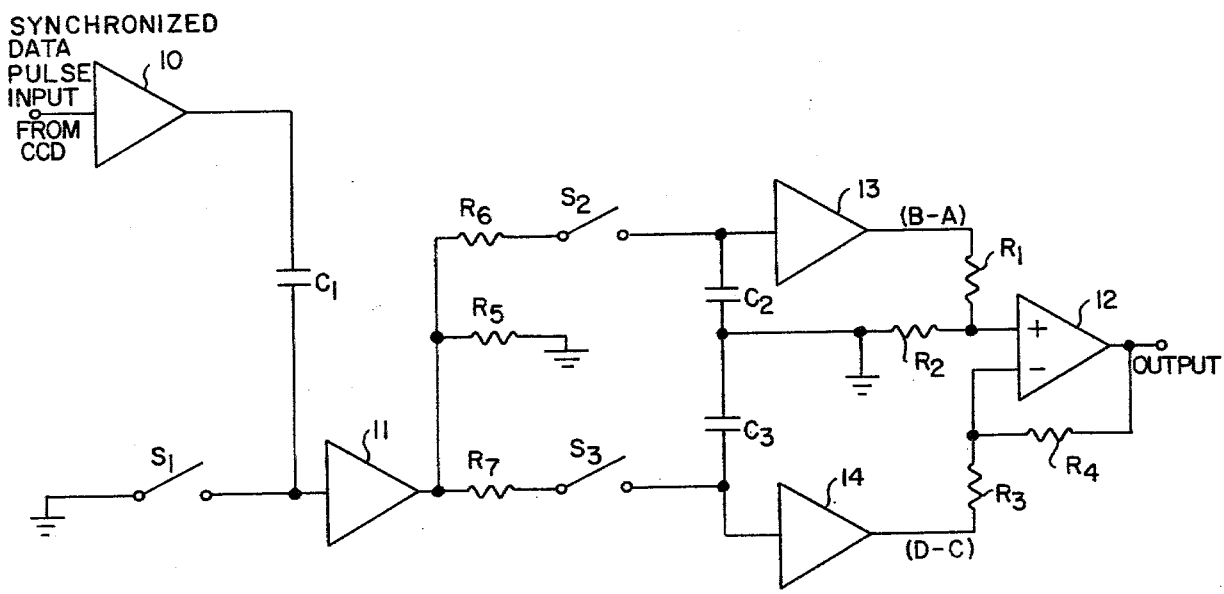
FIG. 1 is a schematic diagram of a first embodiment of the invention.

Referring now to FIG. 1, a new quadruple sampling system for a CCD input signal is shown in a first embodiment. The input from a CCD is normally amplified for use by an amplifier 10. A floating gate field-effect transistor amplifier is used because there is not reset noise in this type of amplifier. Advantage is taken of this fact in the quadruple sampling technique of this circuit by taking a signal sample at time B in FIG. 2 with respect to a reference sample at time A, and a second signal at time D with respect to a reference sample at time C. The negative difference $-(D-C)$ is subtracted from the positive difference (B-A) so that the difference in the second set of the quadruple samples is effectively added to the difference in the first set of the quadruple samples. This doubles the amplitude of the output signal. The noise would be increased by only a factor of the square root of two since there will normally be no correlation in the noise between the two sets of the quadruple samples. With a typical noise spectrum, the increase in noise due to intercorrelation will be only 2%; with a worse case spectrum and $d = \tau$ (FIG. 2), the increase is about 11%. The overall effect is a 40% improvement in signal to noise ratio when using the quadruple sampling technique of this invention instead of the conventional double sampling technique of sampling or clamping the reference level at time A and then sampling the CCD data pulse at time B.

An implementation of the quadruple sampling technique in the first embodiment of FIG. 1 utilizes a switch $S_1$ to clamp the input of an amplifier 11 isolated from the amplifier 10 by a capacitor $C_1$. This switch is used to sample or clamp the CCD signal line at times A and C so that samples taken through switches $S_2$ and $S_3$ at times B and D will be with reference to the clamping level. The samples at times B and D stored in respective capacitors $C_2$ and $C_3$ are thus the respective levels at times B and D minus the clamped levels at times A and C, or algebraically expressed (B-A) and (D-C). The difference between these values thus stored in capacitors $C_2$ and $C_3$ is then found by a differential input operational amplifier 12 having its noninverting input coupled to the capacitor $C_2$ by an amplifier 13 and its inverting input coupled to the capacitor $C_3$ by an amplifier 14.

It should be noted that by clamping the CCD signal line at the input of the amplifier 11, a negative signal (D-C) is stored in the capacitor $C_3$. That negative signal is subtracted from the positive signal (B-A) on capacitor $C_2$ by the differential amplifier 12, producing a signal (B-A)-(D-C). Since the clamped signals at times A and D are zero (ground), the output of the differential amplifier 12 is B+C, thus effectively doubling the CCD sample signal, i.e., producing a net signal gain of 2. It should also be noted that the switches shown schematically as ideal switches are in practice electronic analog switches.

Figure 3:
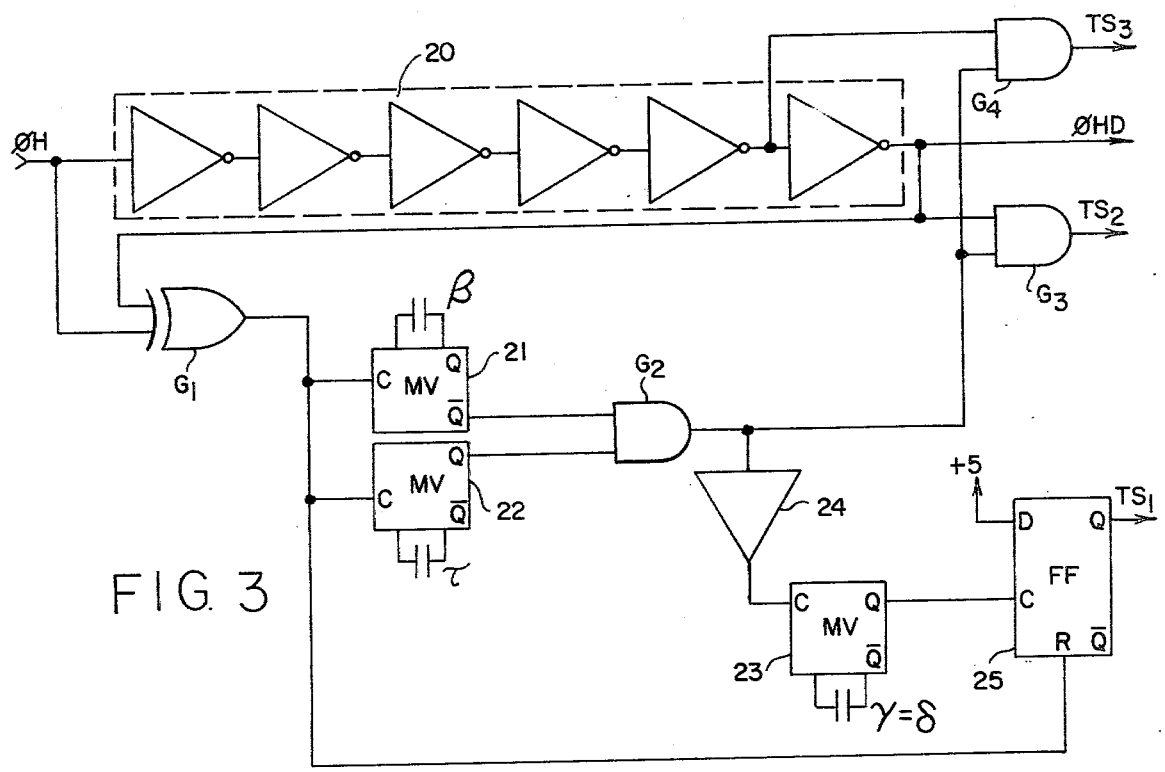
FIG. 3 is a logic diagram of a circuit for generating the switch timing generally indicated in FIG. 2.

The manner in which the timing signals for the switches are implemented with only a data clock signal $\phi H$ needed for synchronization is shown in FIG. 3. The clock signal $\phi H$ is delayed by cascaded inverting amplifier 20 to produce a delayed clock signal $\phi HD$.

Figure 2:
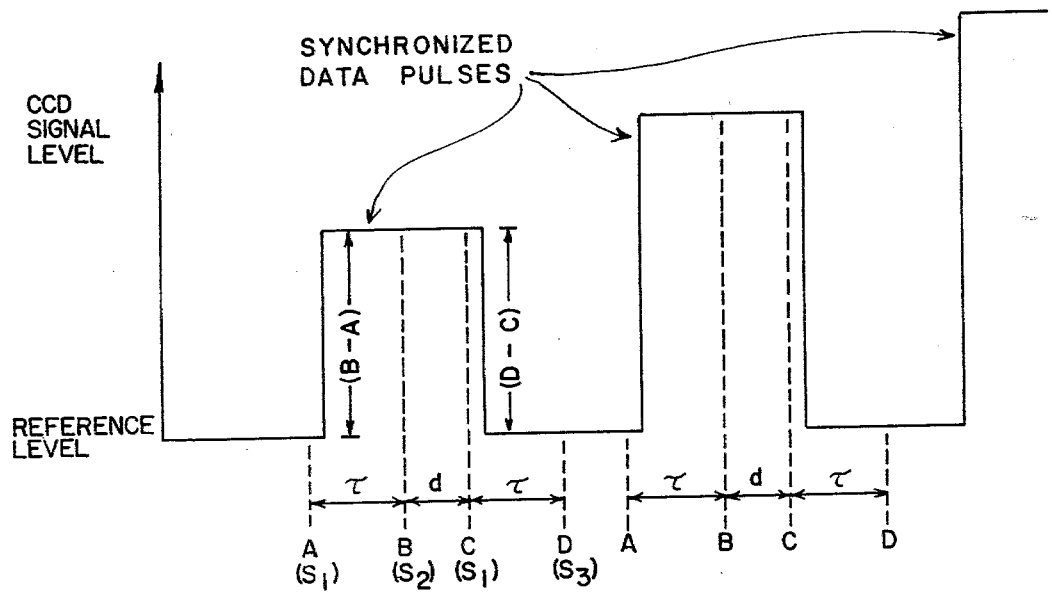
FIG. 2 is a switch timing diagram useful in understanding the embodiment of FIG. 1.
Figure 4:
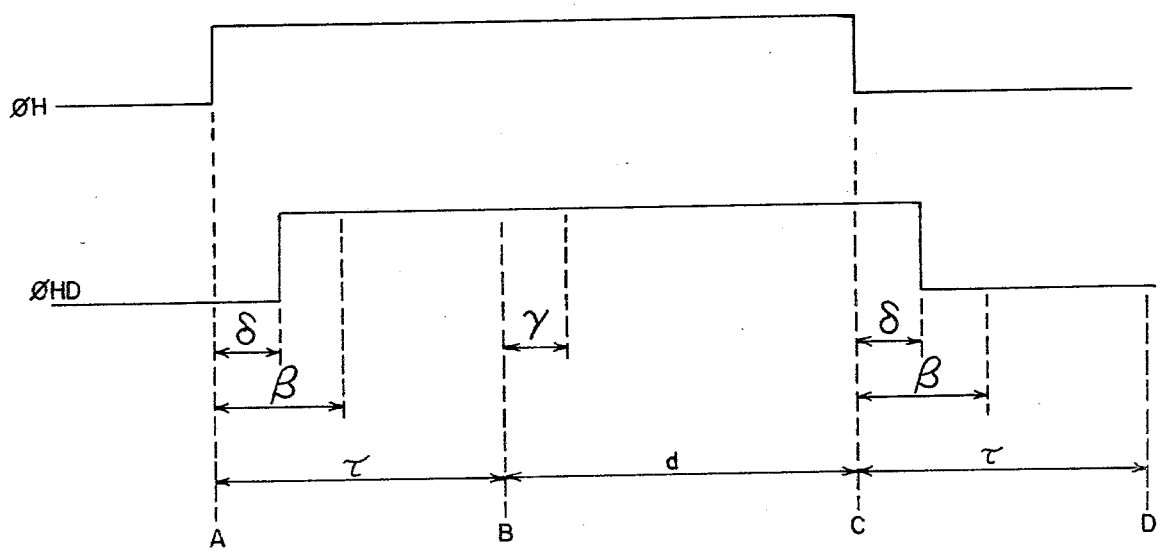
FIG. 4 is a timing diagram for the specific switch timing to be generated by the circuit of FIG. 3 for the embodiment of FIG. 1.

The circuit of FIG. 3 uses three multivibrators 21, 22 and 23 with periods set in each by timing capacitors for the periods shown in FIG. 4. The period $\delta$ is the delay period introduced by the inverting amplifier 20. The period $\beta$ is the interval that must lapse after a sampling time A and a sampling time C before another sampling time can be initiated at times B and D. The period $\tau$ controls the interval between sampling times A and B, and times C and D. Note that the timing signal $TS_1$ is generated twice during each data pulse cycle, once at sampling time C and again at sampling time A after sampling time D, where the second sampling time A is the beginning of the quadruple sampling cycle for the next data pulse as shown in FIG. 2. Timing signal $TS_1$ at sampling time C ends on the trailing edge of the clock pulse $\phi H$. The final sampling time D will occur such that $\tau$ is the same as for sampling time B. The timing signals $TS_1$, $TS_2$ and $TS_3$ drive the three switches $S_1$, $S_2$ and $S_3$, respectively.

Figure 5:
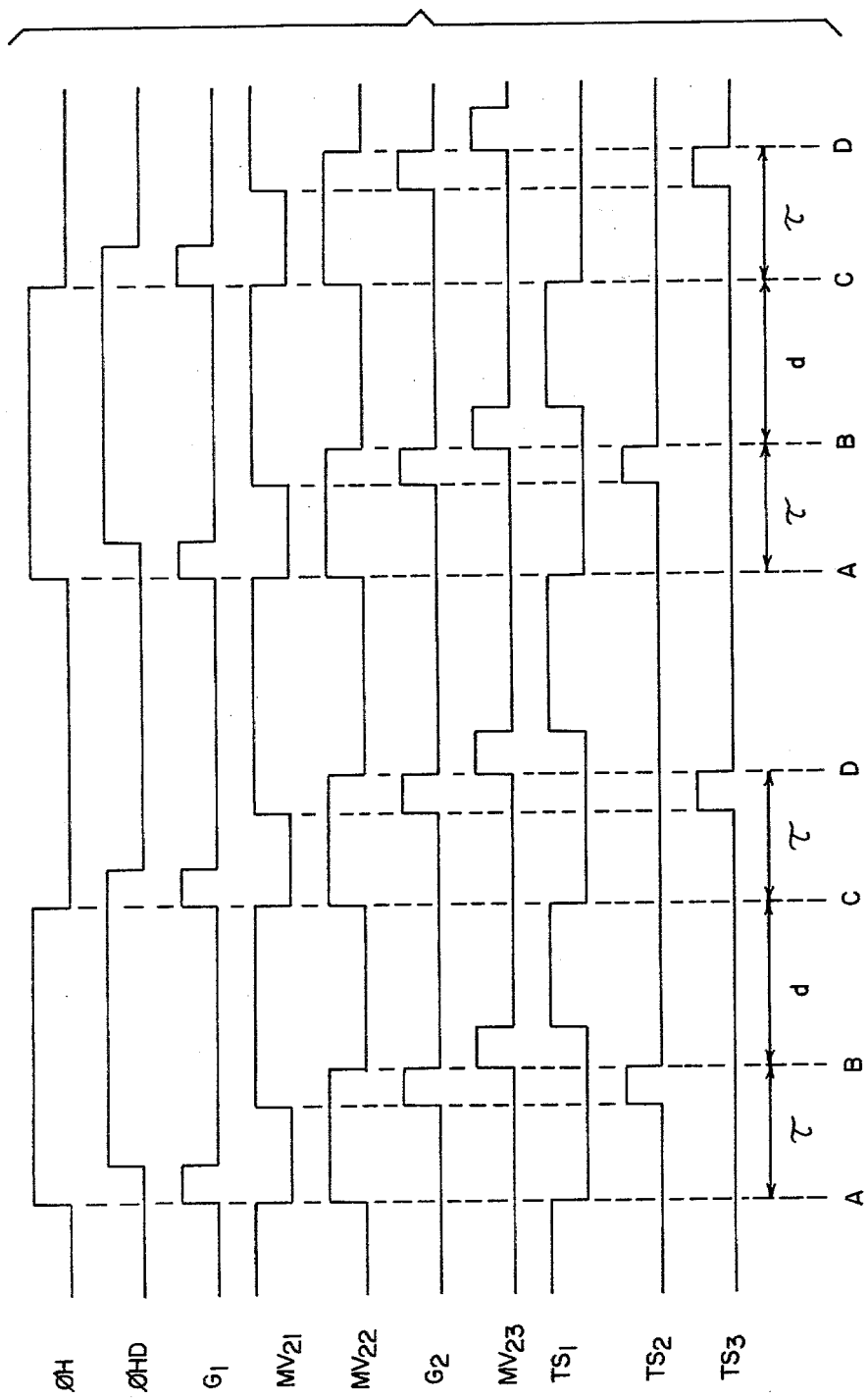
FIG. 5 is a waveform timing diagram useful for understanding the operation of the circuit in FIG. 3 for the embodiment of FIG. 1.

Operation of the timing circuit of FIG. 3 will be better understood from a timing diagram in FIG. 5 wherein the waveforms shown are identified by the same reference characters referred to with reference to FIG. 3. The clock signals $\phi H$ and $\phi HD$ are combined in a Exclusive-Or gate $G_1$ to produce timing pulses shown by the waveform labeled $G_1$ in FIG. 5. These timing pulses trigger the monostable multivibrators 21 and 22 to produce the signals labeled $MV_{21}$ and $MV_{22}$ in FIG. 5. Those two signals are combined in an And gate $G_2$ to produce the pulses labeled $G_2$ in FIG. 5. The output of the gate $G_2$ is coupled by an amplifier 24 to trigger the multivibrator 23. The trailing edge of the pulses $MV_{23}$ thus produced by the multivibrator 23 triggers a D-type flip-flop 25 to set it thus producing a timing signal $TS_1$. The flip-flop 25 is then reset by the leading edge of a pulse from the gate $G_1$ to terminate the first sampling period following time A and again the second sampling period following time C of a data pulse period. Gates $G_3$ and $G_4$ generate the timing signals $TS_2$ and $TS_3$ for the sampling periods at times B and D. Note that these timing signals end at the times B and D, and begin when the multivibrator 21 is triggered. The timing signals $TS_2$ and $TS_3$ are thus produced from the pulses at the output of the gate $G_2$, but the timing signal $TS_2$ is produced only during the presence of the delayed clock $\phi HD$, and the timing signal $TS_3$ only in the absence of a delayed clock, which is to say while $\phi HD$ is not true. The last inverter in the delay chain 20 is used to generate $\overline{\phi HD}$ for gate $G_4$.

Figure 6:
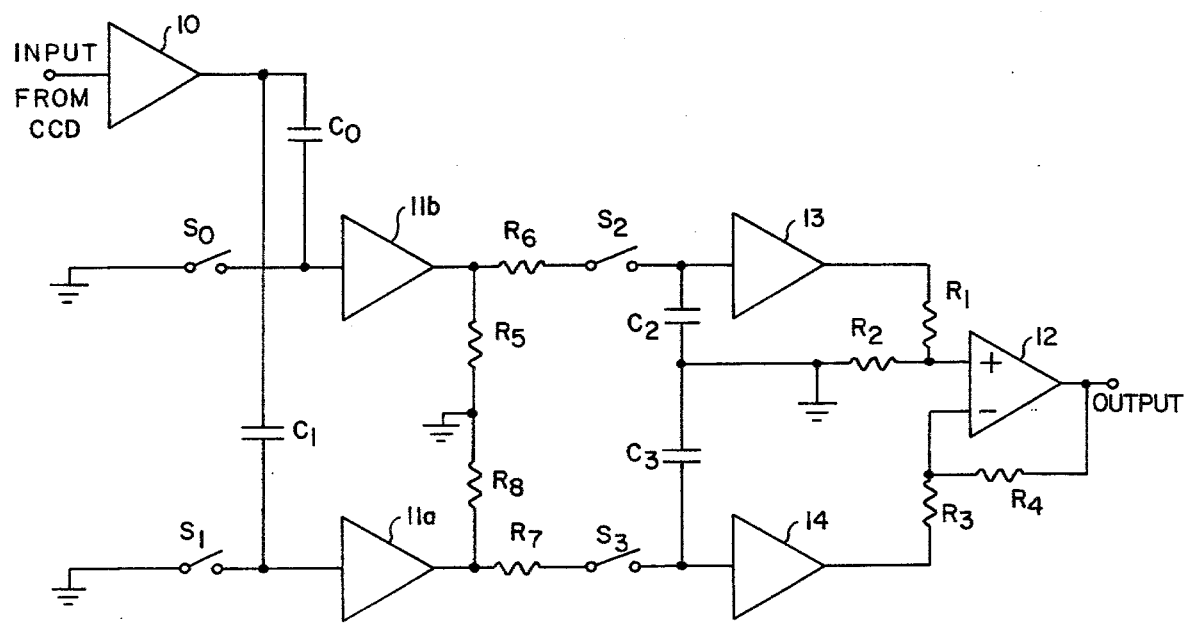
FIG. 6 is a schematic diagram of a second embodiment of the invention.
Figure 7:
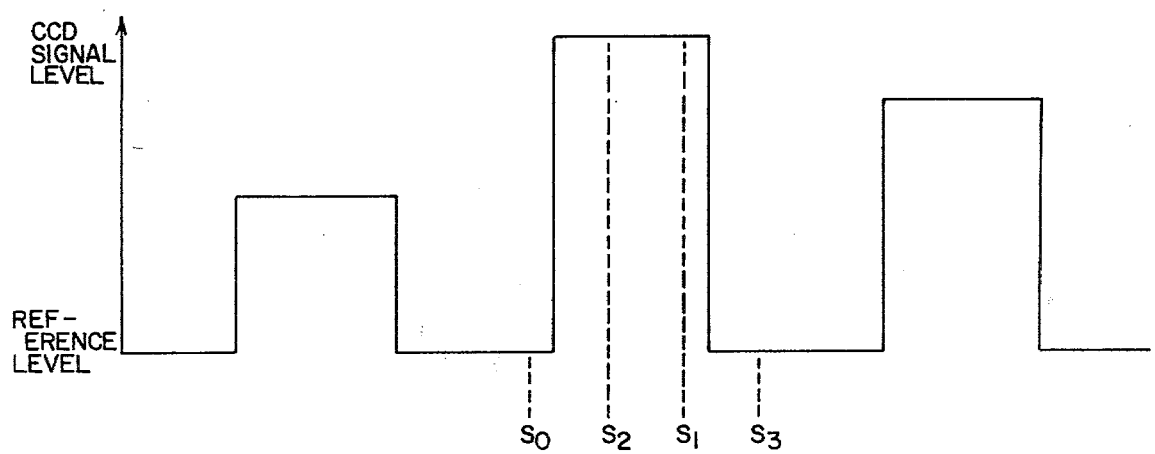
FIG. 7 is a switch timing diagram useful in understanding the second embodiment of FIG. 6.

A preferred embodiment of the invention, illustrated in FIG. 6, utilizes two sampling (clamping) switches $S_0$ and $S_1$. The switch $S_1$ corresponds to the switch identified by the same reference numeral in the embodiment of FIG. 1, but it is here used only to clamp the data signal line to a source of reference potential (ground) at sampling time C. To clamp the data signal line at sampling time A, the switch $S_0$ is closed. Note that the data signal line is isolated from the amplifier 10 by a separate capacitor $C_0$, and that separate amplifiers $11a$ and $11b$ are used for the isolated data signal lines. In that manner, the clamp or reference sample for one does not have any effect on the other.

Operation of the preferred embodiment is similar to that of the first embodiment, except that the timing circuit of FIG. 3 is modified so that separate switch control signals $TS_0$ and $TS_1$ are generated. That may be accomplished by providing a second flip-flop, like the flip-flop 25, and triggering the separate flip-flop through two separate And gates, one enabled to trigger the $TS_1$ flip-flop while $\overline{\phi HD}$ is true, very much like the And gate $G_4$ is used to generate the timing signal $TS_3$, and the other enabled to trigger the $TS_0$ flip-flop while $\phi HD$ is true, very much like the And gate $G_3$ is used to generate the timing signal $TS_2$.

In summary, quadruple sampling is completed once for every cycle of the data clock signal $\phi H$. The delayed clock $\phi HD$ is generated to ensure that the two sampling times A and C controlled by two $S_1$ pulses in FIG. 1, and by $S_0$ and $S_1$ pulses in FIG. 6, can be ended before the CCD output is clocked. The sampling time B controlled by the timing pulse $S_2$ occurs a predetermined period $\beta$ after the rising edge of the signal $\phi H$ and the sampling time D controlled by the timing pulse $S_3$ occurs a predetermined period $\beta$ after the falling edge of the signal $\phi H$. The period $\beta$ between the end of a clamp period and the beginning of a sample period can be adjusted, typically from 200 and 500 nanoseconds. The time $\tau$ between the end of a clamp period and the end of a sample period can be adjusted, typically from 0.4 to 4.5 microseconds. The adjustments of $\beta$ and $\tau$ in the multivibrators 21 and 22 provide the freedom of changing the time between each sample, and changing the duration of each sample, which is effectively $\tau - \beta$. In practice, each clamp period could be started simultaneously with the previous sample period, i.e., $TS_2$ could overlap $TS_1$ (or $TS_0$) and $TS_3$ could overlap $TS_1$, to reduce the bandwidth of the quadruple sampling system. Lowering the bandwidth helps to eliminate high frequency noise and improve the noise performance of the quadruple sampling system.

In both embodiments illustrated, an Analog Devices amplifier (AD521) may be used for the differential amplifier. It includes the resistors $R_1$ and $R_2$ at the noninverting input, and the resistors $R_3$ and $R_4$ at the inverting input, as well as the input buffer amplifier 13 and 14. The switches may be implemented with National Semiconductor switches (AM1000). Resistors $R_5$ and $R_6$ load the amplifier 11b (i.e., limit current), and resistors $R_7$ and $R_8$ load the amplifier 11a. In the embodiment of FIG. 1, resistors $R_5$ and $R_6$ load the amplifier 11 while the switch $S_2$ is closed, and resistors $R_5$ and $R_7$ load the amplifier 11 while the switch $S_3$ is closed.

Although particular embodiments of the invention have been described and illustrated herein, it is recognized that modifications and variations may readily occur to those skilled in the art and consequently, it is intended that the claims be interpreted to cover such modifications and equivalents.

What is claimed is:

1. A method for quadruple sampling clock synchronized data pulses of a clocked source in order to improve the signal amplitude by a factor of about 2 comprising the steps of
   capacitively coupling the clock synchronized data pulses from said device to a data line,
   momentarily clamping the data line to circuit ground before each clock synchronized data pulse,
   sampling the data pulse line voltage with respect to the circuit ground reference established by the previous clamping step, said sampling occurring during the early part of a clock synchronized data pulse, and storing the sampled voltage in a first storage capacitor;
   momentarily clamping the data pulse line to circuit ground during the late part of a clock synchronized data pulse after sampling the clock synchronized pulse,
   sampling the data pulse line voltage with respect to the circuit ground reference established by the previous clamping step, said sampling occurring after the clock synchronized data pulse, and storing the sampled voltage in a second storage capacitor, and
      producing a signal proportional to the absolute sum of the sampled voltage stored in said first and second storage capacitors.

2. The method as defined in claim 1 wherein the sampled voltage stored in said first storage capacitor is positive with respect to circuit ground reference and the sampled voltage stored in said second storage capacitor is negative with respect to circuit ground reference, and wherein the signal proportional to the absolute sum is formed by amplifying the difference between voltages stored in said first and second storage capacitors.

3. Apparatus for quadruple sampling the clock synchronized data pulses of a clocked source in order to improve the signal amplitude by a factor of about 2 comprising
   means for capacitively coupling the clock synchronized data pulses from said device to a data line,
   means for momentarily clamping said data line to circuit ground before each clock synchronized data pulse,
   means for sampling the data pulse line voltage with respect to the circuit ground reference established by the previous clamping step, said sampling occurring during the early part of a clock synchronized data pulse,
   and a first storage capacitor for storing a voltage proportional to said early sampled voltage,
   means for momentarily clamping the data pulse line to circuit ground during the late part of a clock synchronized data pulse after early sampling of the clock synchronized pulse,
   means for sampling the data pulse line voltage with respect to the circuit ground reference established by clamping during the late part of a clock synchronized data pulse, said sampling occurring after the clock synchronized data pulse,
   a second storage capacitor for storing a voltage proportional to said past pulse sampled voltage, and
   means for producing a signal proportional to the absolute sum of the sampled voltage stored in said first and second storage capacitors.

4. A correlated quadruple sampling processor for improved signal-to-noise ratio in the synchronized output of a clocked data source comprised of: first switching means for momentarily clamping device signal line at a first reference level A before a data pulse and then obtaining a first data sample B with respect to the reference level A during a data pulse on said line, and means for storing the positive sample (B-A), second switching means for momentarily clamping the signal line a second time at the level C during the presence of said data pulse and then obtaining a second data sample D with respect to said reference level C after said data pulse, and means for storing the negative sample (D-C), and means obtaining the difference between the stored samples.

5. A correlated quadruple sampling processor as defined in claim 4 wherein said means for storing said positive sample is a first storage capacitor having one terminal connected to circuit ground and its other terminal connected to said first switching means, and said means for storing said negative sample is a second storage capacitor having one terminal connected to circuit ground and its other terminal connected to said second switching means.

6. A correlated quadruple sampling processor as defined in claim 5 wherein said first switching means is comprised of a coupling capacitor in series with said signal line, a shunt switch in series with said coupling capacitor for connecting a junction between said coupling capacitor and shunt switch to circuit ground, and a first series switch connected to said coupling capacitor by a buffer amplifier, said first series switch being for connecting the output of said buffer amplifier to the other terminal of said first storage capacitor, and wherein said second switching means is comprised of said coupling capacitor, said shunt switch and a second series switch connected to said coupling capacitor by said buffer amplifier, said second series switch being for connecting the output of said buffer amplifier coupling capacitor to the other terminal of said second storage capacitor.

7. A correlated quadruple sampling processor as defined in claim 6 wherein said means for obtaining difference between said positive and negative samples is comprised of a differential amplifier for amplifying the difference between said positive sample and said negative sample.

8. A correlated quadruple sampling processor as defined in claim 5 wherein said first switching means is comprised of a first coupling capacitor in series with said signal line, a first shunt switch in series with said first coupling capacitor for connecting a junction between said first coupling capacitor and first shunt switch to circuit ground, and a first series switch connected to said first coupling capacitor by a first buffer amplifier, said first series switch being for connectng the output of said first buffer amplifier to the other terminal of said first storage capacitor, and wherein said second switching means is comprised of a second coupling capacitor in series with said signal line, a second shunt switch in series with said second coupling capacitor for connecting a junction between said second coupling capacitor and second shunt switch to circuit ground, and a second series switch connected to said second coupling capacitor by a second buffer amplifier, said second series switch being for connecting the output of said second buffer amplifier to the other terminal of said second storage capacitor.

9. A correlated quadruple sampling processor as defined in claim 8 wherein said means for obtaining the difference between said positive and negative samples is comprised of a differential amplifier for amplifying the difference between said positive sample and said negative sample.

* * * * *